United States Patent
Shibazaki

(10) Patent No.: US 8,891,064 B2
(45) Date of Patent: Nov. 18, 2014

(54) MOVING BODY APPARATUS AND EXPOSURE APPARATUS

(75) Inventor: Yuichi Shibazaki, Kumagaya (JP)

(73) Assignee: Nikon Corporation, Tokyo (JP)

( * ) Notice: Subject to any disclaimer, the term of this patent is extended or adjusted under 35 U.S.C. 154(b) by 799 days.

(21) Appl. No.: 12/395,962

(22) Filed: Mar. 2, 2009

(65) Prior Publication Data

US 2009/0316133 A1 Dec. 24, 2009

Related U.S. Application Data

(60) Provisional application No. 61/064,957, filed on Apr. 4, 2008.

(30) Foreign Application Priority Data

Mar. 7, 2008 (JP) .................................. 2008-058580

(51) Int. Cl.
H01L 21/68 (2006.01)
G03F 7/20 (2006.01)

(52) U.S. Cl.
CPC .......... *H01L 21/682* (2013.01); *G03F 7/70716* (2013.01); *G03F 7/70758* (2013.01); *G03F 7/70766* (2013.01)
USPC .......... 355/75; 355/72; 310/12.05; 310/12.06

(58) Field of Classification Search
CPC ............ G03F 7/70766; G03F 7/70816; G03F 7/70716; G03F 7/70725; G03F 7/70758; G03F 7/70775; H01L 21/682; H01L 21/68
USPC ......... 310/12.01, 12.05–12.06; 318/560, 632, 318/649; 355/53, 72, 75, 77
See application file for complete search history.

(56) References Cited

U.S. PATENT DOCUMENTS

| | | | |
|---|---|---|---|
| 5,121,898 A * | 6/1992 | Yasuda et al. | 248/550 |
| 6,202,492 B1 * | 3/2001 | Ohsaki | 355/53 |
| 6,339,266 B1 | 1/2002 | Tanaka | |
| 6,449,030 B1 | 9/2002 | Kwan | |
| 6,473,159 B1 | 10/2002 | Wakui et al. | |
| 6,836,093 B1 | 12/2004 | Nishi | |
| 2001/0006762 A1 | 7/2001 | Kwan et al. | |

(Continued)

FOREIGN PATENT DOCUMENTS

| | | |
|---|---|---|
| JP | A-2000-77503 | 3/2000 |
| JP | A-2000-337429 | 12/2000 |

(Continued)

OTHER PUBLICATIONS

Jun. 2, 2009 Search Report issued in International Patent Application No. PCT/JP2009/000888.
Jun. 2, 2009 Written Opinion issued in International Patent Application No. PCT/JP2009/000888 (with translation).
Apr. 15, 2013 Office Action issued in Taiwanese Patent Application No. 098107122 (with translation).
May 1, 2013 Office Action issued in Japanese Patent Application No. 2010-501787 (with translation).

*Primary Examiner* — Colin Kreutzer
(74) *Attorney, Agent, or Firm* — Oliff PLC

(57) ABSTRACT

When a wafer stage WST accelerates and decelerates on a base, a torque that acts on a wafer drive system including the base and the like is cancelled out by a torque that acts on the wafer drive system by driving a counter of a coutermass device along a linear guide in the Z-axis direction at a predetermined acceleration. Thereby, the torque that acts upon the wafer drive system is cancelled and the exposure apparatus can expose the wafer with good accuracy.

21 Claims, 10 Drawing Sheets

(56) References Cited

U.S. PATENT DOCUMENTS

2002/0104950 A1* 8/2002 Mayama .................. 248/638
2003/0184724 A1 10/2003 Ono et al.
2006/0017908 A1 1/2006 Mayama
2007/0229794 A1* 10/2007 Itoh ................................ 355/75

FOREIGN PATENT DOCUMENTS

| | | |
|---|---|---|
| JP | A-2001-304332 | 10/2001 |
| JP | A-2006-32788 | 2/2006 |
| JP | A-2006-173238 | 6/2006 |
| WO | WO 99/48192 A1 | 9/1999 |

* cited by examiner

MOVING BODY APPARATUS AND EXPOSURE APPARATUS

CROSS-REFERENCE TO RELATED APPLICATIONS

This non-provisional application claims the benefit of Provisional Application No. 61/064,957 filed Apr. 4, 2008, the disclosure of which is hereby incorporated herein by reference in its entirety.

BACKGROUND OF THE INVENTION

1. Field of the Invention

The present invention relates to moving body apparatuses and exposure apparatuses, and more particularly, to a moving body apparatus having a moving body which moves on a base having a guide surface, and an exposure apparatus which exposes an object by irradiation of an energy beam.

2. Description of the Background Art

Conventionally, lithography processes that fabricate electronic devices (microdevices), such as semiconductor devices (integrated circuits and the like) and liquid crystal display devices mainly use step-and-repeat type projection exposure apparatuses (so-called steppers), step-and-scan type projection exposure apparatuses (so-called scanning steppers; also called scanners), and the like.

In these types of exposure apparatuses, a stage apparatus that comprises a wafer stage, which holds a substrate (hereinafter generally referred to as a wafer) such as a wafer, a glass plate or the like, and moves within a two dimensional surface, and a drive system, which drives the wafer stage at a prescribed velocity, is generally used. Furthermore, as the patterns transferred to wafers increase in fineness, planar motors, which can position a control target with great speed and accuracy, are used as the drive system of the stage apparatus (e.g., refer to PCT International Publication No. WO99/048192). Compared with an apparatus that uses a rotary motor, a stage apparatus that uses a planar motor has fewer portions subject to mechanical friction; consequently, the apparatus's running cost can be reduced and its configuration simplified; therefore, such stage apparatuses will likely be widely used in the future.

Not withstanding the above, when a planar motor drives a wafer stage, the reaction force of that driving force might act on the stator; if it does, vibrations that arise in the apparatus owing to this reaction force will degrade exposure accuracy.

SUMMARY OF THE INVENTION

The present invention was conceived given the circumstances discussed above, and a first aspect of the invention is a moving body apparatus, comprising: a base that has a guide surface; a moving body that moves on the guide surface; a planar motor that comprises a first member that is provided to the base and a second member that is provided to the moving body and that, through the cooperation of the first member and the second member, generates a thrust between the base and the moving body that moves the moving body along the guide surface; and a canceling device that, when the moving body moves owing to the thrust of the planar motor, applies a force to the base in a direction that cancels a torque generated around the center of gravity of a system that includes the base and the moving body.

In addition, a second aspect of the invention is a moving body apparatus, comprising: a base that has a guide surface; a moving body that moves on the guide surface; a drive system that generates a thrust between the base and the moving body that moves the moving body along the guide surface; and a canceling device that, through the movement of the moving body, applies a force to the base in a direction that cancels a torque generated around the center of gravity of a system that includes the base and the moving body; wherein, the canceling device comprises: a mass body, which moves in an orthogonal axial direction, which is a direction orthogonal to the guide surface; a guide that is provided to the base and guides the mass body in the orthogonal axial direction; and an actuator that moves the mass body with respect to the guide in accordance with the movement of the moving body.

In addition, a third aspect of the invention is an exposure apparatus that exposes an object by irradiating an energy beam, comprising: the moving body apparatus of the present invention in which the object is held by the moving body.

DESCRIPTION OF THE EMBODIMENTS

The text below explains one embodiment of the present invention, referencing FIG. 1 through FIG. 11.

Figure 1:
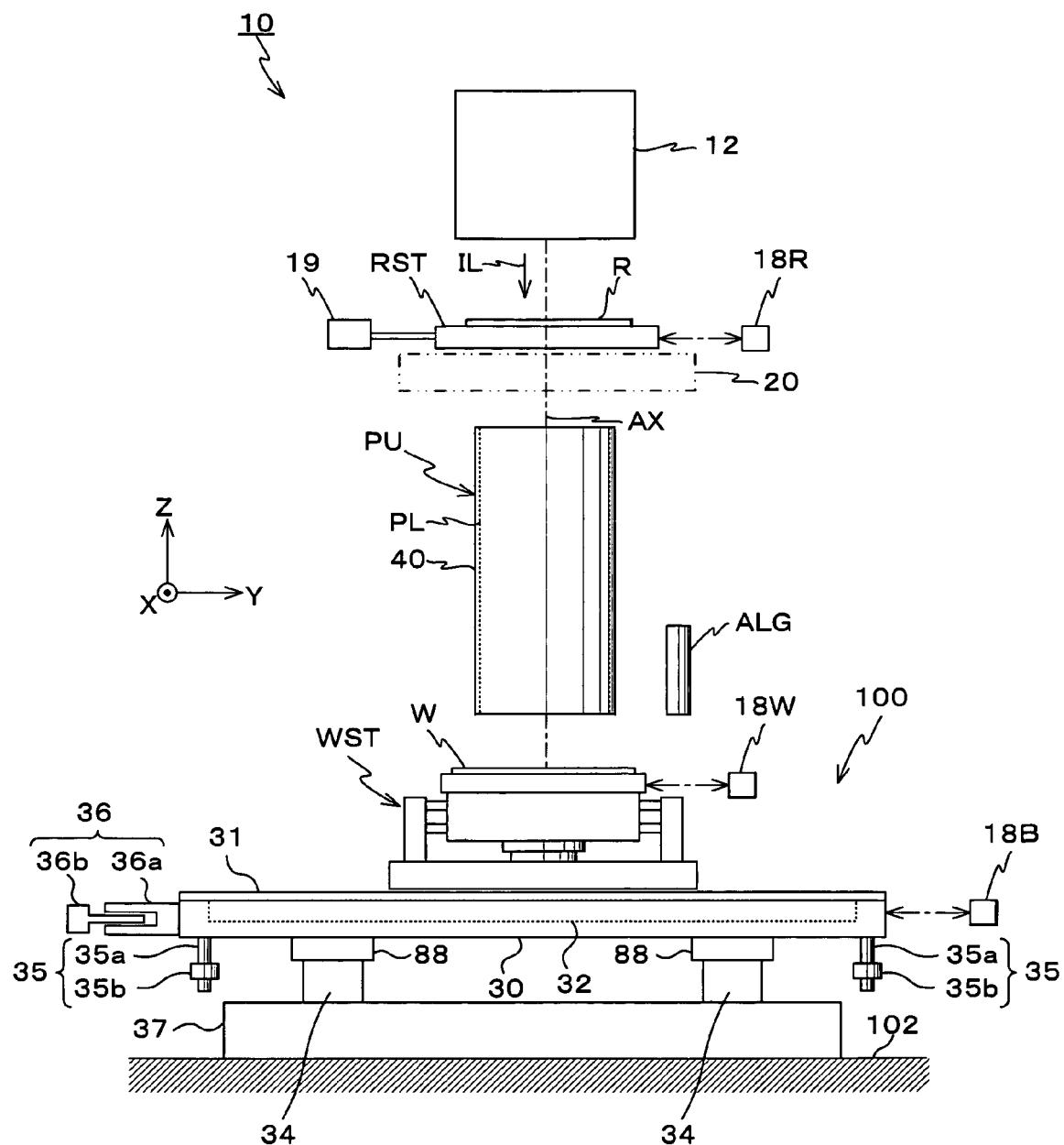
FIG. 1 schematically shows the configuration of an exposure apparatus according to one embodiment of the present invention.

FIG. 1 schematically shows the configuration of an exposure apparatus 10 according to the present embodiment. The exposure apparatus 10 is a step-and-scan-type scanning exposure apparatus (i.e., a scanning stepper). In the present embodiment as discussed below, a projection optical system PL is provided; furthermore, in the explanation below, the directions of an optical axis AX of the projection optical system PL are the Z axial directions, the directions in which a reticle R and a wafer W are scanned relative to one another within a plane orthogonal thereto are the Y axial directions, the directions orthogonal to the Z axis and the Y axis are the X axial directions, and the rotational directions around axes parallel to the X, Y, and Z axes are the θx, θy, and θz directions, respectively.

The exposure apparatus 10 comprises: an illumination system 12, which comprises a light source and an illumination optical system and illuminates the reticle R with an illumination light IL (i.e., exposure light); a reticle stage RST, which holds the reticle R; a projection unit PU; a wafer stage apparatus 100, which comprises a wafer stage WST whereon the wafer W is mounted; and a control system that controls these members.

The illumination system 12 illuminates a slit shaped illumination area, which is defined by a reticle blind (not shown), on the reticle R with the illumination light IL at a substantially uniform luminous flux intensity. Here, as one example, ArF excimer laser light (with a wavelength of 193 nm) is used as the illumination light IL.

The reticle stage RST is disposed on a reticle stage base 20, which is disposed in an XY plane, and is levitationally supported above the reticle stage base 20 by magnetic levitational forces generated by, for example, magnetic levitational two-dimensional linear actuators that constitute a reticle stage drive system 19. Furthermore, the reticle R is fixed on the reticle stage RST by, for example, vacuum chucking or electrostatic chucking.

The driving force generated by the reticle stage drive system 19 drives the reticle stage RST with a prescribed stroke in the Y axial directions and also finely drives the reticle stage RST in the X axial directions and the θz directions; furthermore, by the adjustment of the magnetic levitational force generated by the reticle stage drive system 19 at a plurality of locations, the reticle stage drive system 19 can also finely drive the reticle stage RST in the inclination directions (i.e., the θx directions and θy directions) with respect to the XY plane and in the Z axial directions.

A reticle interferometer 18R (hereinbelow, "reticle interferometer"), which irradiates a laser beam to a reflecting surface fixed to (or formed on) the reticle stage RST, can continuously detect, with a resolving power of, for example, approximately 0.25-1.0 nm, the position (including the θz rotation) of the reticle stage RST (and, in turn, the reticle R) within an XY plane. Furthermore, a reticle focus sensor (not shown) that comprises a multipoint focal point position detection system, as disclosed in, for example, U.S. Pat. No. 5,448,332, obtains the position of the reticle R in the Z axial directions.

The measurement values of the reticle interferometer 18R and the reticle focus sensor are supplied to a main control apparatus 11 (refer to FIG. 10), which drives the reticle stage RST via the reticle stage drive system 19 based on these measurement values.

Projection unit PU is placed below reticle stage RST in FIG. 1. The projection unit PU comprises a cylindrically shaped lens barrel 40 and a projection optical system PL, which comprises a plurality of optical elements that are held by the lens barrel 40.

A dioptric system and the like that comprises a plurality of optical elements (i.e., lens elements) arrayed along the optical axis AX, which is parallel to the Z axis, is used as the projection optical system PL. The projection optical system PL is, for example, double telecentric and has a prescribed projection magnification (e.g., ¼×, ⅕×, or ⅛×). Consequently, when the illumination light IL from the illumination system 12 illuminates the illumination area, the illumination light IL that passes through the reticle R, whose pattern surface is disposed substantially coincident with a first plane (i.e., the object plane) of the projection optical system PL, travels through the projection optical system PL and forms a reduced image of a circuit pattern that lies within that illumination area of the reticle R (specifically, a reduced image of part of the circuit pattern) on the wafer W, which is disposed on a second plane (i.e., image plane) side of the projection optical system PL and whose front surface is coated with a resist (i.e., a photosensitive agent), in an area (i.e., an exposure area) that is conjugate with the illumination area. Furthermore, by synchronously scanning the reticle stage RST and the wafer stage WST, the reticle R is moved relative to the illumination area (i.e., the illumination light IL) in one of the scanning directions (i.e., the Y axial directions) and the wafer W is moved relative to the exposure area (i.e., the illumination light IL) in the other scanning direction (i.e., the other Y axial direction); thereby, a single shot region (i.e., block area) on the wafer W undergoes a scanning exposure and the pattern of the reticle R is transferred to that shot region. Namely, in the present embodiment, the pattern is created on the wafer W by the illumination system 12 and the projection optical system PL, and that pattern is formed on the wafer W by exposing a photosensitive (i.e., resist) layer on the wafer W with the illumination light IL.

The wafer stage apparatus 100 comprises: a base 30; an XY trim motor 36, which finely moves the base 30 within the XY plane; the wafer stage WST, which moves along an upper surface (i.e., in an XY plane) of the base 30; a drive system, which drives the wafer stage WST; and a plurality of countermass devices 35, which cancel the torque acting on the base 30 that accompanies the movement of the wafer stage WST.

The base 30, in whose upper surface side a magnet unit 32 is embedded, is a square plate shaped member supported substantially horizontally above a support platform 37, which is installed on a floor surface 102, such that the base 30 is supported by a plurality of vibration isolating devices 34 with support devices 88 including a plurality of rolling elements 88a (e.g., a ball, a roller and the like) interposed therebetween.

The magnet unit 32 comprises a plurality of permanent magnets, which generate magnetic fields in the Z axial directions, and interpolation magnets, which generate magnetic fields in the Y and X axial directions. Furthermore, the permanent magnets are disposed in a matrix such that the orientations of the magnetic fields between adjacent permanent magnets are the reverse of one another. In addition, each of the interpolation magnets is disposed between adjacent permanent magnets such that the orientation of the magnetic fields generated by each of the interpolation magnets coincides with the orientation of the magnetic fields generated between the corresponding adjacent permanent magnets. Thereby, the magnet unit 32 is configured such that a magnetic circuit, where through a magnetic flux circulates via the interpolation magnets, is formed between adjacent permanent magnets. The magnet unit 32 is embedded in the base 30 from the upper surface side and a protective plate 31, which comprises a nonmagnetic body, is fixed to the upper surface of the base 30 such that it covers the magnet unit 32. The protective plate 31 prevents direct contact between the wafer stage WST and the magnet unit 32 and constitutes a guide surface when the wafer stage WST is moved.

Figure 2:
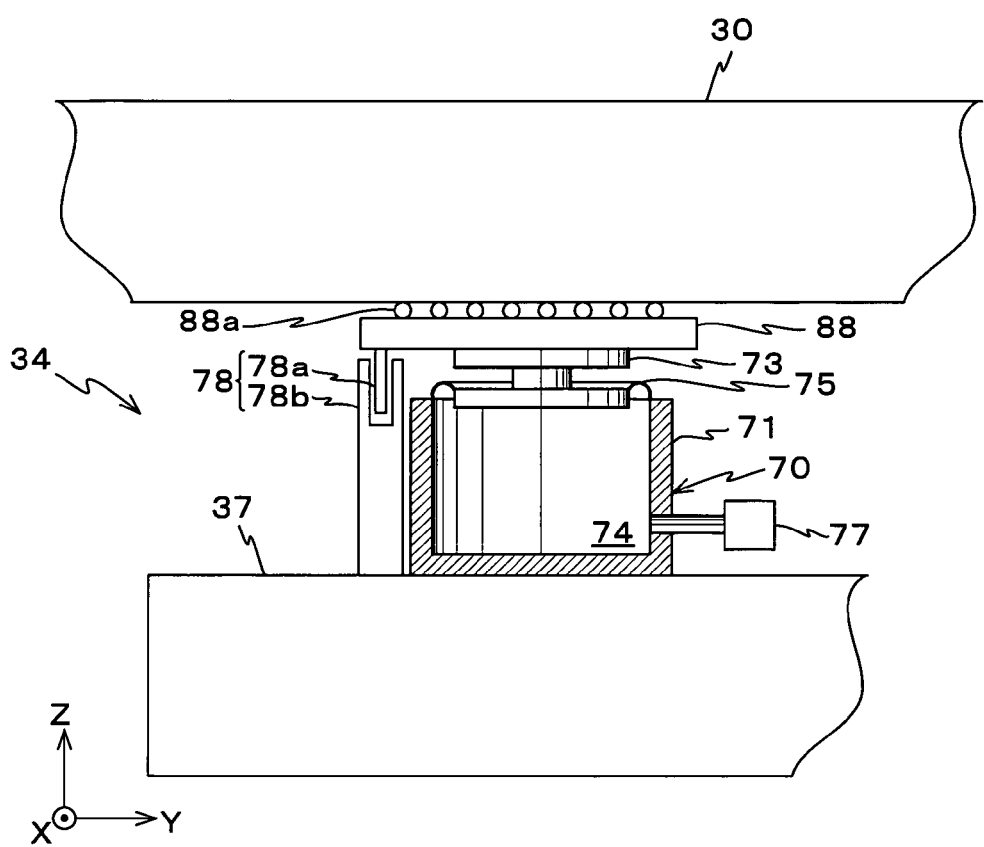
FIG. 2 is a view that shows the vicinity of a vibration isolation device.

FIG. 2 shows one of the vibration isolating device 34 that supports the base 30. As shown in FIG. 2, the vibration isolating device 34 comprises: an air mount 70, which is fixed to an upper surface support platform 37; and a voice coil motor 78, which is capable of finely driving the base 30 in the vertical directions (i.e., the Z axial directions) with high responsiveness.

The air mount 70 comprises: a housing 71, which has an opening in its upper part; a holding member 73, which is placed in the state wherein the opening of the housing 71 is plugged; a diaphragm 75, which is connected to the housing 71 and the holding member 73 and forms a gas chamber 74 in the state wherein both the housing 71 and the holding member 73 are substantially airtight; and an electromagnetic regulator 77 (hereinbelow, also called a "regulator" where appropriate), which adjusts the pressure of gas, such as, for example, air, that fills the interior of the gas chamber 74.

The voice coil motor 78 comprises a mover 78a, which is attached to the lower surface of the base 30 via the support device 88, and a stator 78b, which applies an electromagnetic force to the mover 78a in the Z axial directions.

Based on the measurement value of a pressure sensor (not shown), the main control apparatus 11 (refer to FIG. 10) controls the pressure of the gas inside the gas chamber 74 of the vibration isolating device 34 by controlling the electromagnetic regulator 77. Thereby, the vibration component, for example, of approximately 20 Hz that propagates from the floor surface 102 (refer to FIG. 1) via the support platform 37 is eliminated. In addition, controlling the gas inside the gas chamber 74 only makes it possible to eliminate vibration components of approximately 20 Hz; consequently, in parallel with controlling the electromagnetic regulator 77, the main control apparatus 11 controls the voice coil motor 78 in accordance with output from, for example, an acceleration sensor (not shown) that detects vibrations of the base 30. Thereby, the base 30 and the support platform 37, which is mounted on the floor surface F, are vibrationally isolated at the micro G level.

In addition, the base 30 is supported by the vibration isolating device 34 via the support device 88 and consequently can move relative to the vibration isolating device 34 in the X and Y axial directions. A thrust bearing, an air bearing, or the like can be used as the support device 88. Furthermore, the position (including the Oz rotation) of the base 30 within the XY plane is continuously detected with a resolving power of, for example, approximately 0.25-1.0 nm by laser interferometers (hereinbelow, called "base interferometers") 18B (refer to FIG. 1), each of which radiates a laser beam to a side surface of the base 30. Furthermore, although FIG. 1 represents the base interferometers 18B as a single base interferometer 18B, in fact a separate base interferometer 18B is placed for position measurement in the X axial directions and for position measurement in the Y axial directions.

As shown in FIG. 1, the XY trim motor 36 comprises: a mover 36a, which is attached to a side surface of the base 30; and a stator 36b, which applies an electromagnetic force to the mover 36a in the X and Y axial directions. Furthermore, when the reaction force that arises when the wafer stage WST moves on the base 30 with a prescribed acceleration additionally moves the base 30 within the XY plane, the main control apparatus 11 (refer to FIG. 10) also moves the base 30, which has moved owing to the reaction force, in a direction opposite that of the reaction force by controlling the XY trim motor 36 while monitoring the base interferometers 18B.

Figure 3:
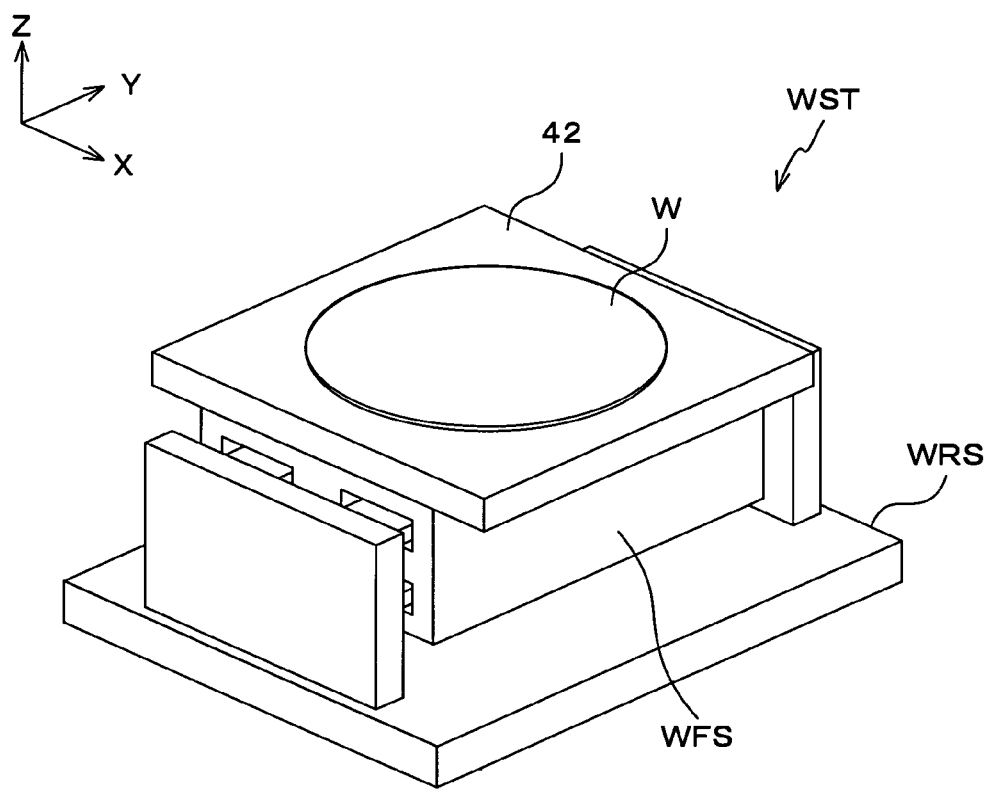
FIG. 3 is an oblique view that shows a wafer stage.

FIG. 3 is an oblique view of the wafer stage WST. As shown in FIG. 3, the wafer stage WST comprises a coarse motion stage WRS, a fine motion stage WFS, which is disposed moveably on the coarse motion stage WRS, and a wafer table 42, which is supported by the fine motion stage WFS.

Figure 4:
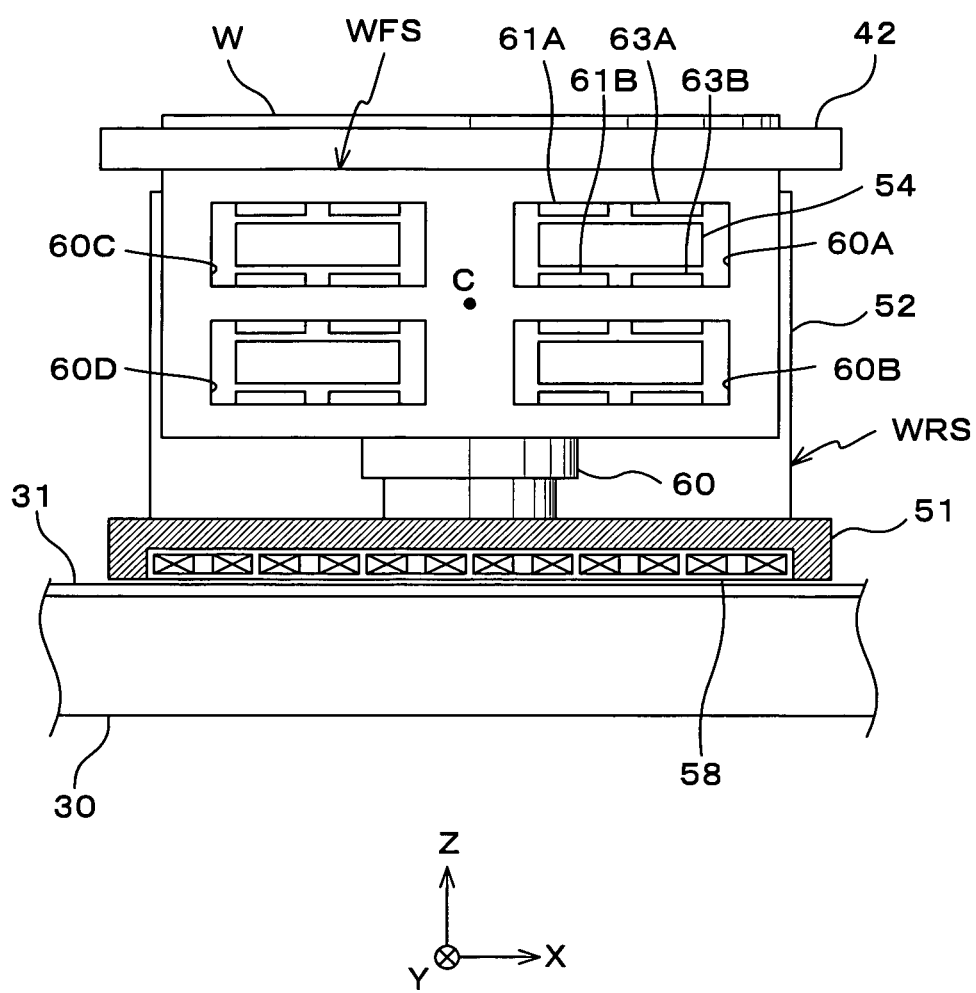
FIG. 4 is a partial cross sectional view (part 1) of the wafer stage.
Figure 5:
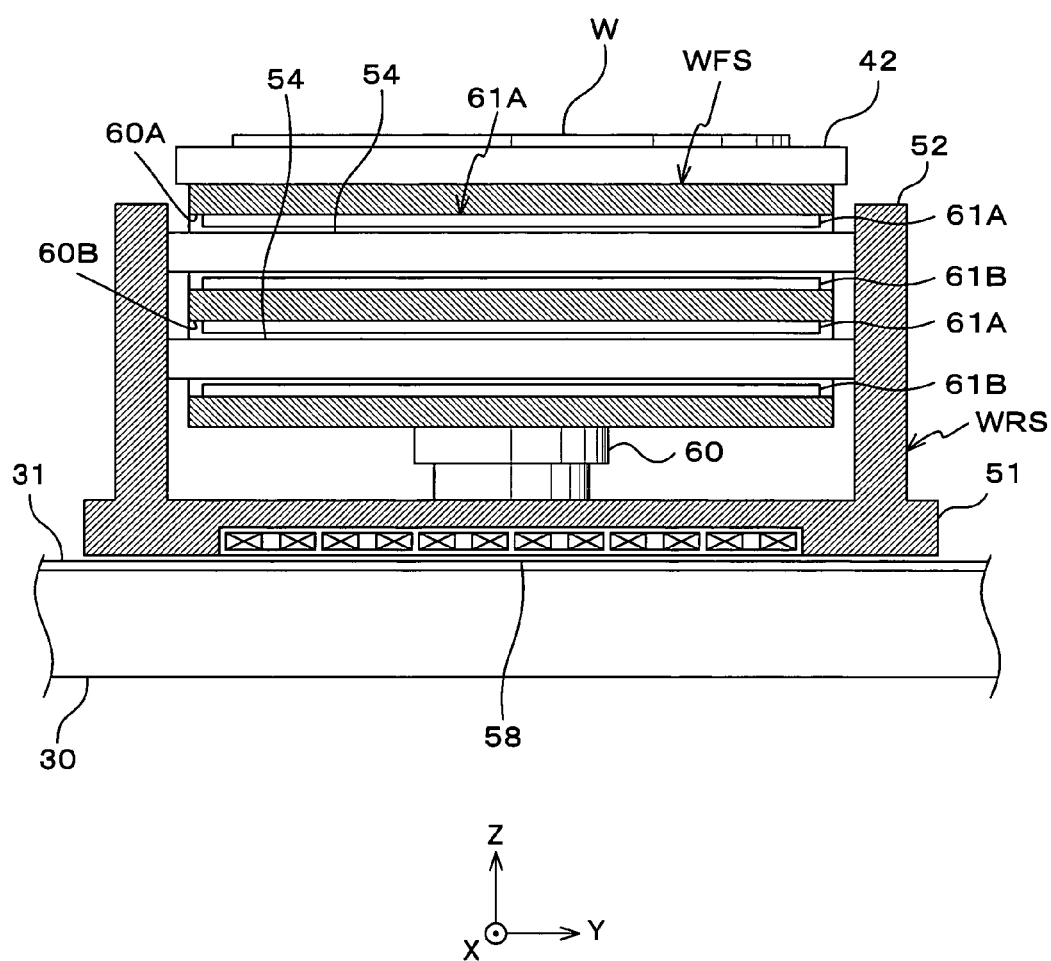
FIG. 5 is a partial cross sectional view (part 2) of the wafer stage.

FIG. 4 is a sectional view (a partial cross sectional view) of the wafer stage WST, viewed toward the +Y direction, and FIG. 5 is a sectional view (a partial cross sectional view) of the wafer stage WST, viewed toward the −X direction. As referencing FIG. 4 and FIG. 5 makes evident, the coarse motion stage WRS is a member that is U shaped in the ZY cross section and comprises a square plate shaped base part 51 and a pair of support parts 52, which is provided to the upper surface of the base part 51 such that one of the support parts 52 extends upward (i.e., in the +Z direction) from each of the side end parts, namely the +Y and −Y side end parts, of the base part 51.

Armature unit 58 is housed in a bottom side (a face side of −Z side) of base region 51. The armature unit 58 comprises a plurality of coils that generates a magnetic field in the Z axial directions in accordance with the magnitude of the electric current supplied thereto; furthermore, with the magnet unit 32, which is placed at the base 30 discussed above, constitute a planar motor (i.e., an XY drive system) that drives the coarse motion stage WRS on the upper surface of the protective plate 31, which is placed on to the upper surface of the base 30.

In addition, four guides 54, whose longitudinal directions are oriented in the Y axial directions, are supported at each of their side end parts, namely their +Y and −Y side end parts, by one of the two support parts 52 of the coarse motion stage WRS and are thereby suspended in the state wherein they are proximate to one another in the Z axial and X axial directions.

Figure 6A:
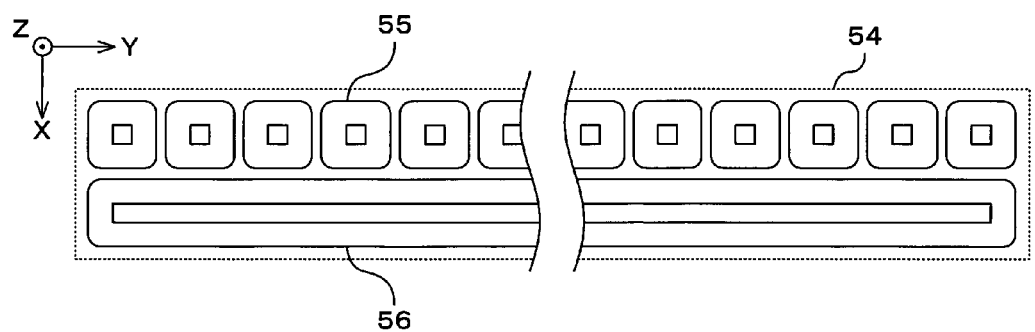
FIGS. 6A and 6B are views (parts 1 and 2) that show stator coils that constitute a guide 54.
Figure 6B:
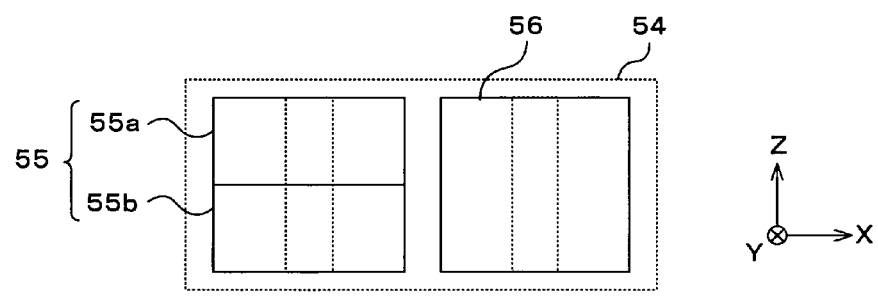

As referencing FIG. 6A and FIG. 6B makes evident, multiple stator coils 55, which are an upper part winding 55a and a lower part winding 55b in a square shape in a planar view (i.e., when viewed from above) and disposed such that they overlap in the vertical directions, are disposed equispaced along the Y axis on the −X side of the interior of the guide 54. In addition, a stator coil 56, which is oblong in a plan view, is disposed on the +X side of the interior of the guide 54 such that its longitudinal directions are oriented in the Y axial directions. Furthermore, FIG. 6A and FIG. 6B show only one of the four guides 54 shown in FIG. 4 and FIG. 5. Below, FIG. 7A and FIG. 7B, FIG. 8A and FIG. 8B, and FIG. 9 are used to explain a single guide 54; however, the configuration of the stator coils 55, 56 placed on the guide 54 and the generation principle of the forces that accompany such a configuration are common to each of the guides 54. Furthermore, the four guides 54 are placed so that the corresponding stator coils 55, 56 of each of the guides 54 are point symmetric in a cross section, as shown in FIG. 4, with respect to a center C (refer to FIG. 4, or, alternatively, the center of gravity) of the fine motion stage WFS. However, the layout is not limited thereto; and the four guides can be placed, for example, so that every two vertical or horizontal pairs of guides in the drawing are line symmetric. Further, in FIG. 7A, FIG. 8A and FIG. 8B, the multiple stator coils 55 will be described, with reference numerals $55_1$, $55_2$, and $55_3$ being given to the coils in the order from the −Y side to the +Y side.

As referencing FIG. 4 and FIG. 5 makes evident, the fine motion stage WFS, whose longitudinal directions are oriented in the Y axial directions, is a rectangular parallelepipedic member formed in the state wherein four openings 60A, 60B, 60C, 60D, which pass from the +Y side through to the −Y side, are proximate to one another in the Z axial and X axial directions. Furthermore, magnetic units 61A, 63A, whose longitudinal directions are oriented in the Y axial directions, are fixed to the upper side surfaces of the pair of surfaces of the openings 60A-60D that face upward and downward such that they are proximate to one another in the X axial directions, and magnetic units 61B, 63B, whose longitudinal directions are oriented in the Y axial directions, are fixed to the lower side surfaces of those surfaces of the openings 60A-60D that face upward and downward such that they are proximate to one another in the X axial directions.

The fine motion stage WFS is mounted to the coarse motion stage WRS in the state wherein one of the guides 54 is inserted into each of the four openings 60A-60D. In addition, the upper surface of the base part 51 of the coarse motion stage WRS, supports the weight of the fine motion stage WFS, which is mounted to the coarse motion stage WRS, via a support apparatus 60 (i.e., a self weight canceller). Thereby, the four guides 54 do not mechanically interfere with any of the magnetic units 61A, 61B, 63A, and 63B.

The wafer table 42 is made of a plate-like member which is a rough square in a planar view and the lower surface is fixed to the upper surface of the fine motion stage WFS, and the wafer W is electrostatically chucked or vacuum chucked to the upper surface of the wafer table 42 via, for example, a wafer holder (not shown). In addition, a fiducial mark plate (not shown) is fixed to the upper surface of the wafer table 42 in the state wherein the front surface of the fiducial mark plate is at substantially the same height as that of the wafer W. At least one pair of first fiducial marks for reticle alignment and a second fiducial mark for baseline measurement of an off-axis alignment system, which is disposed such that it has a known positional relationship with respect to these first fiducial marks, are formed on the front surface of the fiducial mark plate. Furthermore, reflecting surfaces are formed by mirror polishing the side surface on the +Y side and the side surface on the −X side of the wafer table 42.

Figure 7A:
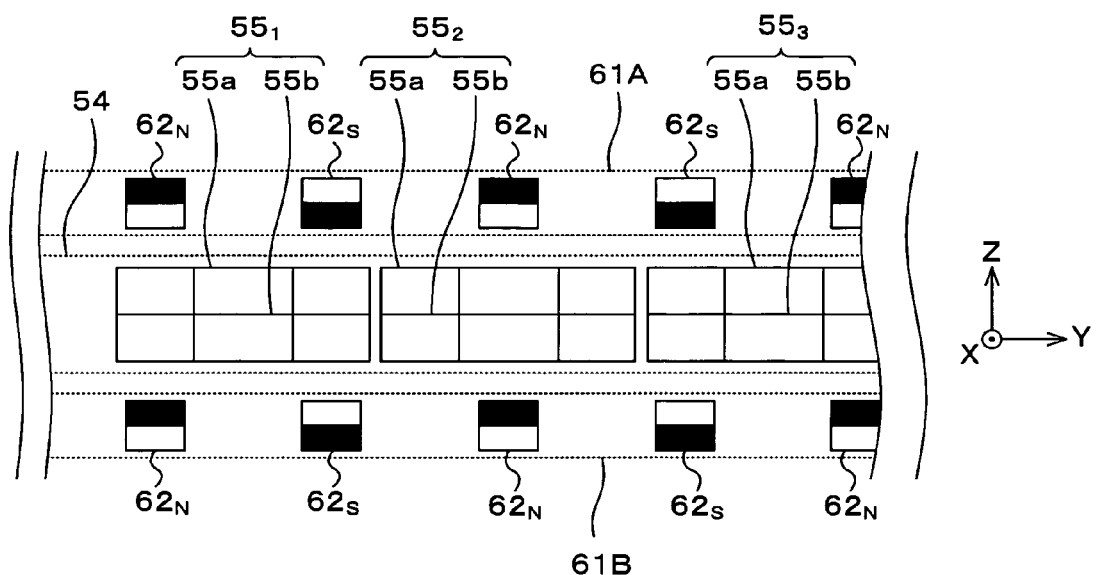
FIGS. 7A and 7B are views (parts 1 and 2) for explaining the layout of windings of the stator coils and permanent magnets of magnet units.
Figure 7B:
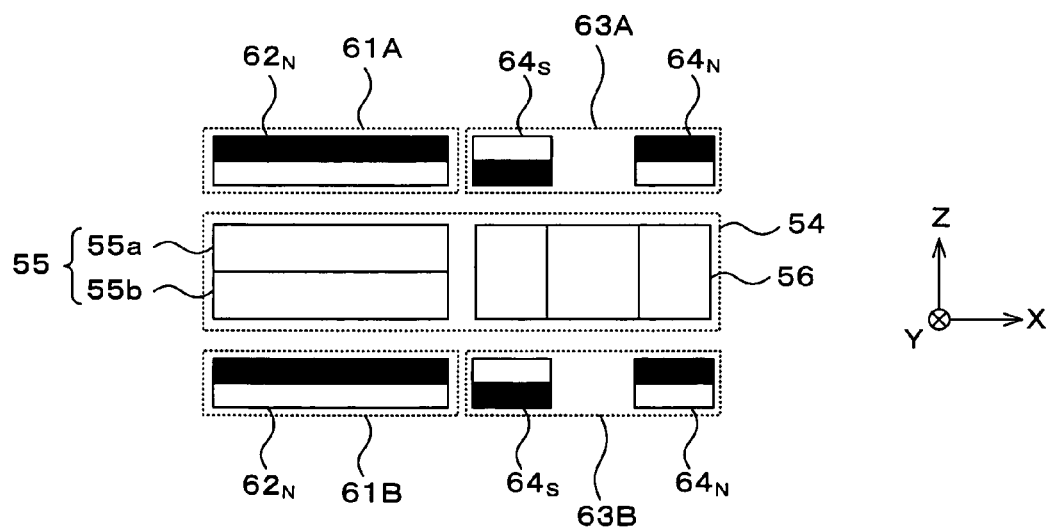

When, as discussed above and shown in, for example, FIG. 4, the fine motion stage WFS is mounted to the coarse motion stage WRS, the magnetic units 61A, 63A are each positioned above the guides 54, and the magnetic units 61B, 63B are each positioned below the guides 54. In addition, when in this state, the magnetic units 61A, 61B are disposed, as shown in FIG. 7A and FIG. 7B, such that they oppose one another with the stator coil 55, which is placed inside the guide 54, interposed therebetween. And, as shown in FIG. 7B, the magnetic units 63A, 63B are disposed in the state wherein they oppose one another with the stator coil 56, which is placed inside the guide 54, interposed therebetween.

Magnetic units 61A and 61B each have a plurality of permanent magnets $62_N$ whose upper surface side (the +Z side) is an N pole and a plurality of permanent magnets $62_S$ whose bottom surface side (the −Z side) is an S pole. In the magnetic units 61A, 61B, the plurality of permanent magnets $62_N$ and the plurality of permanent magnets $62_S$ are arrayed alternately, and also equispaced along the Y-axis. Further, permanent magnet $62_N$ which magnet unit 61A has is placed facing permanent magnet $62_S$ which magnet unit 61B has, and permanent magnet $62_S$ which magnet unit 61A have is placed facing permanent magnet $62_N$ which magnet unit 61B has. Thereby, the orientations of the magnetic fields formed in the space interposed by the magnetic unit 61A and the magnetic unit 61B axial directions alternate in the Y axial directions.

Further, in magnet unit 61A, as shown in FIG. 7A, for example, the distance between adjacent permanent magnets $62_N$ and $62_S$ is set so that in a state where the center of stator coil $55_2$ is placed right under one permanent magnet $62_N$ of the plurality of permanent magnets which magnetic unit 61A has, permanent magnets $62_S$, $62_N$ that make a pair and are adjacent to the one permanent magnet $62_N$ in the −Y direction are each placed above the upper part winding $55a$ of stator coil $55_1$, and permanent magnets $62_S$, $62_N$ that make a pair and are also adjacent to the one permanent magnet $62_N$ in the +Y direction are each placed above the upper part winding $55a$ of stator coil $55_3$. The distance between a plurality of permanent magnets $62_N$, $62_S$ which magnet unit 61B has is set in a similar manner as the distance between the plurality of permanent magnet $62_N$, $62_S$ which magnet unit 61A has.

Figure 8A:
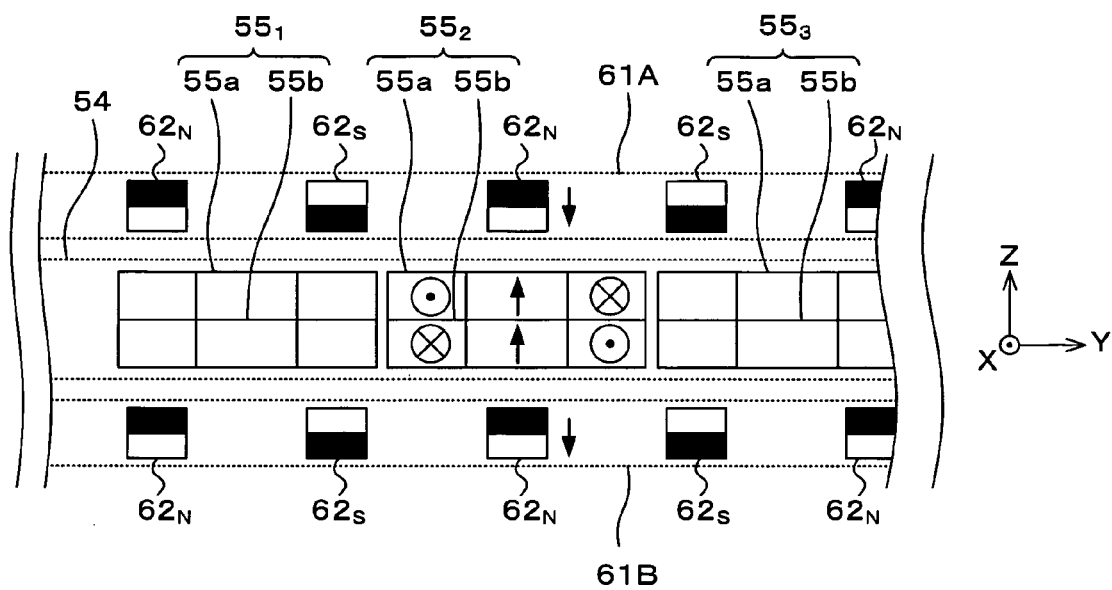
FIGS. 8A and 8B are views (parts 1 and 2) for explaining the operation of the stator coils and the magnet units.

Accordingly, in one example, as shown by the stator coil $55_2$ in FIG. 8A, by supplying a clockwise current when viewed from the −Z direction to the upper part winding $55a$ of the stator coil 55 whose center is positioned directly below the permanent magnet $62_N$, an N pole is formed above the stator coil 55; in addition, by supplying a counterclockwise current when viewed from the −Z direction to the lower part winding $55b$, an N pole is formed below the stator coil 55. Thereby, an attractive force is generated between the stator coil 55 and the magnetic unit 61A, and a repulsive force (repulsion) is generated between the stator coil 55 and the magnetic pole unit 61B. Because these forces act on the fine motion stage WFS as a downward thrust, the fine motion stage WFS can be moved downward (i.e., in the −Z direction) relative to the coarse motion stage WRS.

Similarly, by supplying a counterclockwise current when viewed from the −Z direction to the upper part winding $55a$ of the stator coil 55 whose center is positioned directly below the permanent magnet $62_N$, an S pole is formed above that stator coil 55; in addition, by supplying a clockwise current when viewed from the −Z direction to the lower part winding $55b$, an S pole is formed below that stator coil 55. Thereby, a repulsive force can be generated between the stator coil 55 and the magnetic unit 61A, and an attractive force can be generated between the stator coil 55 and the magnetic pole unit 61B. Because these forces act on the fine motion stage WFS as an upward thrust, the fine motion stage WFS can be moved upward (i.e., in the +Z direction) relative to the coarse motion stage WRS.

Figure 8B:
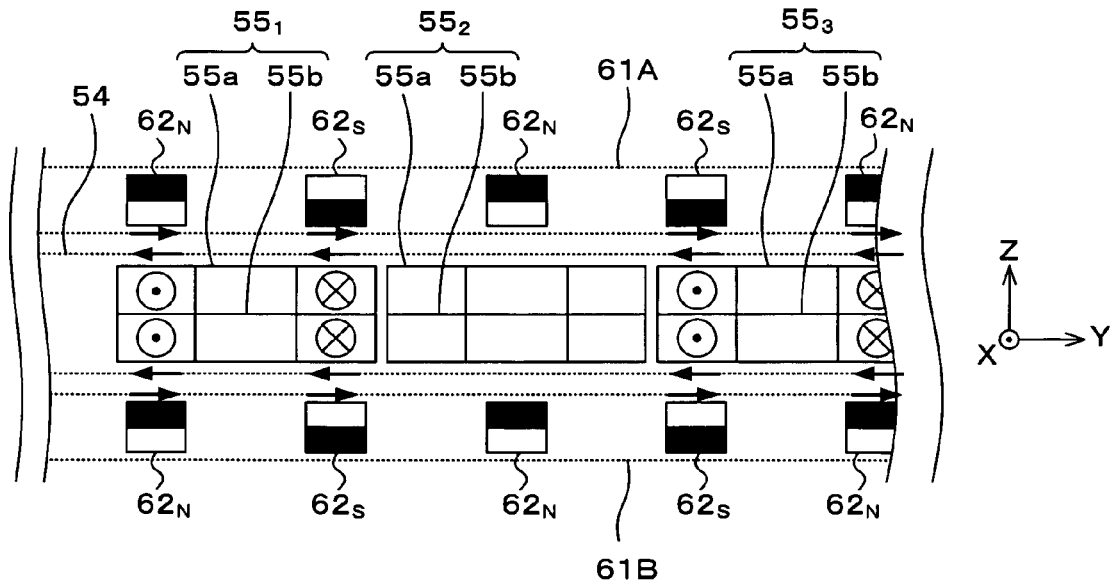

In addition, in one example, as with the stator coils $55_1$, $55_3$ shown in FIG. 8B, by supplying a clockwise current when viewed from the −Z direction to each of the windings $55a$, $55b$ of the stator coil 55 whose windings $55a$, $55b$ are each positioned directly below adjacent permanent magnets $62_S$, $62_N$, −Y direction forces (Lorentz's forces) are applied to each of the windings $55a$, $55b$ and +Y direction forces are applied to the permanent magnets 62 as a reaction. Because the forces that act on the permanent magnets 62 collectively act as a +Y direction thrust on the fine motion stage WFS, the fine motion stage WFS can be moved relative to the coarse motion stage WRS in the +Y direction.

Similarly, by supplying a counterclockwise current when viewed from the −Z direction to each of the windings $55a$, $55b$ of the stator coils 55 whose windings $55a$, $55b$ are each positioned directly below adjacent permanent magnets $62_S$, $62_N$, +Y direction forces are applied to each of the windings $55a$, $55b$ and −Y direction forces are applied to the permanent magnets 62 as a reaction. Because the forces that act on the permanent magnets 62 collectively act as a −Y direction thrust on the fine motion stage WFS, the fine motion stage WFS can be moved relative to the coarse motion stage WRS in the −Y direction.

Further, as it can be seen when referring to FIG. 7B, magnet units 63A, 63B each have a pair of permanent magnets 64 ($64_S$, $64_N$) placed at a predetermined interval in the X-axis direction. Of the pair of permanent magnets 64, as for the permanent magnet on the −X side, an upper surface side (the +Z side) becomes an S pole, respectively, and as for the permanent magnet on the +X side, an upper surface side (the −Z side) becomes an N pole, respectively. Hereinbelow, the permanent magnets 64 whose upper surface sides are S poles are expressed as permanent magnets $64_S$, and the permanent magnets 64 whose upper surface sides are N poles are expressed as permanent magnets $64_N$. Thereby, a downward magnetic field is formed in the space interposed between the pair of permanent magnets $64_S$, and an upward magnetic field is formed in the space interposed between the pair of permanent magnets $64_N$. And a pair of permanent magnets $64_S$ is placed on the upside and downside of the stator coil 56 on the −X side end, and a pair of permanent magnets $64_N$ is placed on the upside and downside of the stator coil 56 on the +X side end.

Figure 9:
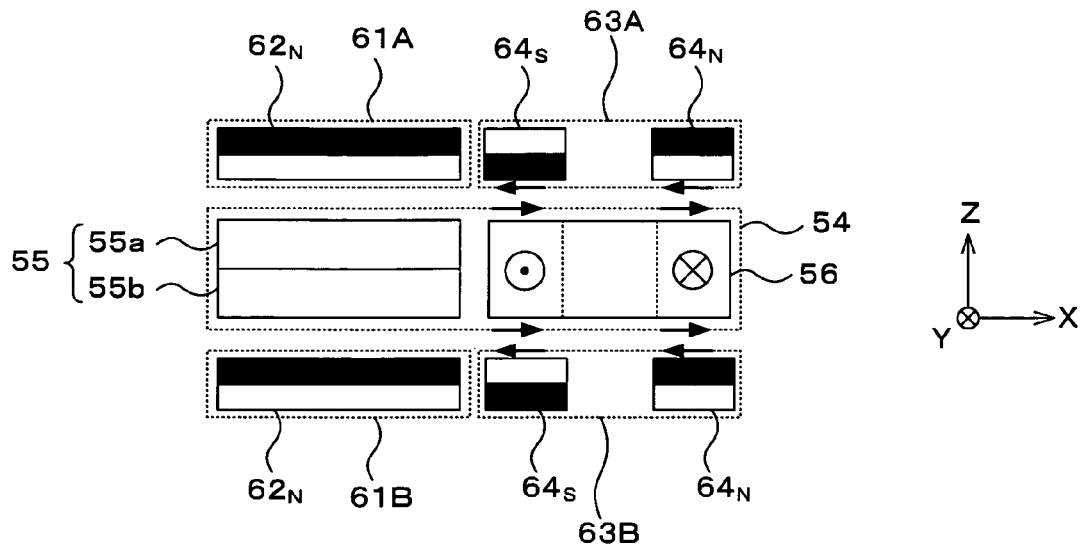
FIG. 9 is a view (part 3) for explaining the operation of the stator coils and the magnet units.

Accordingly, in one example, as shown in FIG. 9, when a clockwise current when viewed from the −Z direction is supplied to the stator coil 56, an example seeing from −Z-direction, +X direction forces (Lorentz's forces) are applied to the stator coil 56, and −X direction forces are applied to permanent magnets 64 (64$_S$, 64$_N$) as a reaction. Because the forces that act on the permanent magnets 64 collectively act as a −X direction thrust on the fine motion stage WFS, the fine motion stage WFS can be moved relative to the coarse motion stage WRS in the −X direction.

Similarly, when a counterclockwise current when viewed from the −Z direction is supplied to the stator coil 56, −X direction forces are applied to the stator coil 56, and +X direction forces are applied to permanent magnets 64 as a reaction. Similarly, by supplying a counterclockwise current around the Z axis to the stator coil 56, a −X direction force can be applied to the winding thereof and +X direction forces can be applied to the permanent magnets 64.

As is evident from the explanation above, the wafer stage apparatus 100 of the present embodiment comprises an XY drive system XYM (i.e., a planar motor) that uses the magnet unit 32, which is fixed to the base 30, and the armature unit 58, which is fixed to the coarse motion stage WRS, to drive the wafer stage WST within an XY plane. In addition, the wafer stage WST of the present embodiment comprises four YZ drive systems YZ1, YZ2, YZ3, YZ4 (refer to FIG. 10 for each one) that use coils 55, which are fixed to the guides 54 inserted into the openings 60A-60D of the fine motion stage WFS, and the magnetic units 61A, 61B, which are fixed to a pair of opposing surfaces which set each of the openings 60A-60D, to drive the fine motion stage WFS relative to the coarse motion stage WRS in both the Y axial and Z axial directions. In addition, the wafer stage WST of the present embodiment comprises four X drive systems X1, X2, X3, X4 (refer to FIG. 10 for each one) that use the coils 56, which are fixed to the guides 54 inserted into each of the openings 60A-60D of the fine motion stage WFS, and the magnetic units 63A, 63B, which are fixed to a pair of opposing surfaces which set each of the openings 60A-60D, to drive the fine motion stage WFS relative to the coarse motion stage WRS in the X axial directions.

Thereby, in the wafer stage apparatus 100, by generating different thrusts in one part of the YZ drive systems YZ1-YZ4 and other parts, fine motion stage WFS can be rotated around the Z-axis and/or the Y-axis. To be more concrete, by applying thrusts of different magnitudes to the fine motion stage WFS in the Y axial directions between the YZ drive system YZ1 (and/or the YZ drive system YZ2), and the YZ drive system YZ3 (and/or the YZ drive system YZ4), the fine motion stage WFS can be rotated around the Z axis. In addition, by applying thrusts of different magnitudes to the fine motion stage WFS in the Y axial directions between the YZ drive system YZ1 (and/or the YZ drive system YZ3), and the YZ drive system YZ2 (and/or the YZ drive system YZ4), the fine motion stage WFS can be rotated around the X axis. In addition, in the wafer stage apparatus 100, by generating different thrusts in one part of the X drive systems X1-X4 and other parts, fine motion stage WFS can be rotated around the Y-axis. To be more concrete, by applying thrusts of different magnitudes in the X axial directions between the X drive system X1 (and/or the X drive system X3), and the X drive system X2 (and/or the X drive system X4), the fine motion stage WFS can be rotated around the Y axis.

Returning to FIG. 1, wafer laser interferometers 18W (hereinbelow, called "wafer interferometers") each radiate a laser beam to a side surface of the wafer table 42 and can continuously obtain the position (including rotational information in the θz direction) of the wafer stage WST within an XY plane with a resolving power of, for example, approximately 0.5-1.0 nm. Furthermore, although FIG. 1 represents the wafer interferometers 18W as a single wafer interferometer 18W, in fact, the wafer interferometer 18W includes an interferometer for position measurement in the X axial directions and an interferometer for position measurement in the Y axial directions. In addition, the laser interferometer 18W for position measurement in the X axial directions and the laser interferometer 18W for position measurement in the Y axial directions together constitute a multiaxis interferometer that has a plurality of length measuring axes; in addition to obtaining the X and Y positions of the wafer table 42, the multiaxis interferometer can also obtain the rotation information, (yawing amount information (rotation information in the θz direction), pitching amount information (rotation information in the θx direction), and rolling amount information (rotation information in the θy direction)).

A wafer focus sensor WF (refer to FIG. 10) obtains both the position in the Z axial direction and the amount of inclination of the wafer W surface held by wafer stage WST, similar to the reticle focus sensor discussed above attached to the lens barrel 40 of the projection unit PU via a holding apparatus (not shown), which is disclosed in detail in, for example, U.S. Pat. No. 5,448,332.

The positional information (or the velocity information) regarding the wafer table 42 and the wafer W is sent to the main control apparatus 11, which controls the coarse motion stage WRS and the fine motion stage WFS via the XY drive system XYM, the four YZ drive systems YZ1-YZ4, and the four X drive systems X1-X4 based on this positional information (or velocity information).

Figure 11:
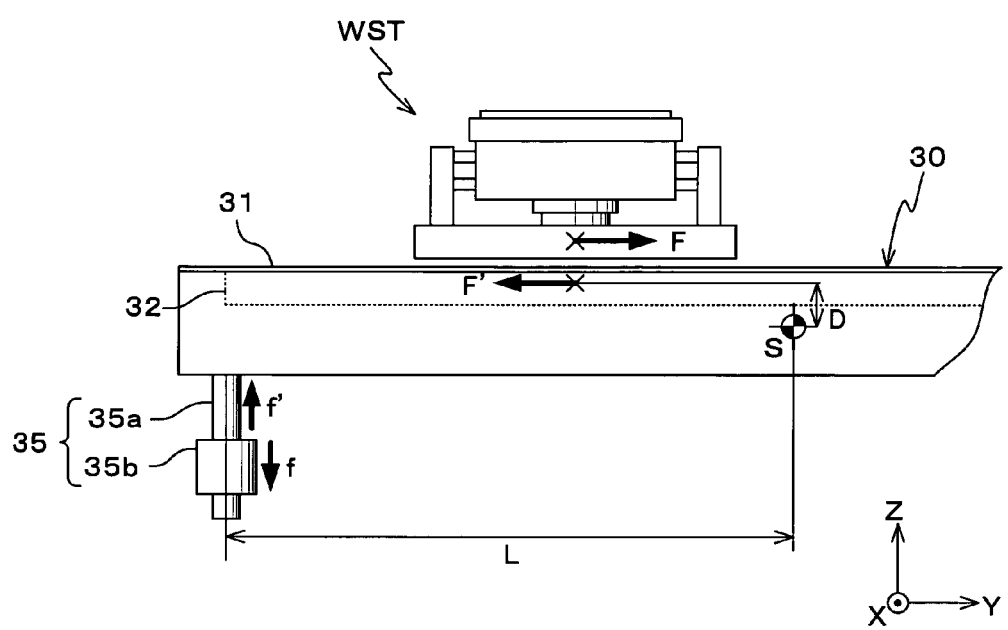
FIG. 11 is a view for explaining the operation of a countermass device 35.

In this case, when the XY drive system XYM accelerates or decelerates the wafer stage WST on the upper surface of the base 30, an electromagnetic force is applied between the magnet unit 32, which is provided to the base 30, and the armature unit 58 of the wafer stage WST. For example, as shown in FIG. 11, if a thrust F is applied to the wafer stage WST in the +Y direction, then a reaction force F' that counteracts the thrust F is applied to the magnet unit 32 in the −Y direction. Furthermore, this reaction force F' acts as a torque in the system that includes the wafer stage WST, the base 30, and the magnet unit 32 (hereinbelow, abbreviated as the wafer drive system) around, for example, an axis S that is parallel to the X axis and passes through the center of gravity of that system; furthermore, the magnitude of that torque (pitching moment) is a product of the reaction force F' and a distance D that extends in the Z axial directions from the axis S to the point at which the reaction force F' is applied.

Each of the plurality of countermass devices 35 are for applying a force to the base 30 in a direction that cancels the torque that arises at the torque of the system that comprises the base 30 and the wafer stage WST. As shown in FIG. 1, the countermass devices 35 are placed each on the side end parts, namely the −Y and +Y side end parts, of the lower surface of the base 30; furthermore, each of the countermass devices 35 comprises a linear guide 35a, which is fixed to the lower surface of the base 30 such that its longitudinal directions are oriented in the Z axial directions, and an annular countermass 35b, which is capable of moving along the linear guide 35a in the Z axial directions.

Each of the linear guides 35a is configured such that, for example, a plurality of armature coils is disposed therein in the Z axial directions. In addition, each of the annular countermasses 35b is attached to its corresponding linear guide 35a, in the state wherein the linear guide 35a is inserted therethrough, and is configured such that the permanent magnet placed on countermass 35b opposes the corresponding linear guide 35a. Namely, each of the permanent magnets of the countermasses 35b combine with the armature coil of the corresponding linear guide 35a to constitute a linear motor that moves the countermass 35b in the Z axial directions; furthermore, the main control apparatus 11 (refer to FIG. 10) can raise and lower the countermass 35b along the linear guide 35a by controlling an electric current supplied to the armature coil of the linear guide 35a.

In the present embodiment, when the wafer stage WST accelerates and decelerates due to a thrust applied to the wafer stage WST, the main control apparatus 11 moves the countermass 35b of the countermass device 35 along the linear guide 35a and thereby cancels the torque that acts upon the wafer drive system as discussed above. Specifically, the main control apparatus 11 applies a reaction force f' that counteracts a thrust f to the linear guide 35a by applying the thrust f to the countermass 35b.

Thereby, a torque, whose magnitude is the product of the reaction force f' and the distance L that extends in the Y axial directions from the point of application of the reaction force f' to the axis S, acts upon the wafer drive system. This torque acts around the axis S of the wafer drive system and is expressed by equation (1) below, wherein M is the mass of the countermass 35b and a is the acceleration.

$$f' \cdot L = M \cdot a \cdot L \tag{1}$$

Accordingly, the main control apparatus 11 moves the countermass 35b along the linear guide 35a with an acceleration a whose magnitude is expressed by equation (2) below. Thereby, the torque generated around the axis S when the wafer stage WST is driven is offset by the torque generated when the countermass 35b is driven.

$$a = F' \cdot D / (M \cdot L) \tag{2}$$

Because the thrust F becomes known before the XY drive system XYM is driven, if the information is included in a drive signal or the like sent to the XY drive system XYM, the reaction force F' can be predicted. Accordingly, if a predetermined thrust F is decided, the acceleration a described above can be obtained, and the drive of countermass 35 can be controlled in a feedforward manner. However, the control is not limited to this, and for example, feedback control can be performed to drive countermass 35 by directly detecting reaction force F' with sensors and the like, and obtaining the acceleration a described above. This allows the torque which is generated around the axis S of the wafer drive system to be canceled, even in the case when the correspondence of thrust F and reaction force F' does not satisfy a predetermined relation by disturbance and the like. Incidentally, the disturbance can be suppressed also by the vibration isolation device 34, and the main control apparatus 11 can cancel the torque which is generated around the axis S of the wafer drive system by appropriately controlling vibration isolation device 34 and countermass device 35 so as not to be affected by the disturbance.

Furthermore, for the sake of convenience, the explanation herein explains a case wherein the torque generated around the axis S of the wafer drive system when the wafer stage WST is driven is cancelled using just one countermass device 35 as shown in FIG. 11, but the torque generated around the axis S of the wafer drive system may be cancelled using two countermass devices 35. In such a case, both countermasses 35b should be driven by the two countermass devices 35 such that the magnitude of the torque applied around the axis S of the wafer drive system and the magnitude of the torque generated around the axis S when the wafer stage WST is driven are made equal. Further, a configuration where three or more countermass devices are provided can be employed.

In the embodiment, the countermass device 35 was fixed to support platform 37 within the XY plane; however, the present invention is not limited to this. For example, the countermass device 35 can be moved in the XY direction with respect to the support platform 37. And the position to which the reaction force f' generated by countermass device 35 is applied, can be changed according to the position of support platform 37 to which the reaction force of F' of XY drive system XYM is applied. In this case, a position of the countermass device 35 can be controlled so that the operative positions of both reaction forces are as close as possible.

Figure 10:
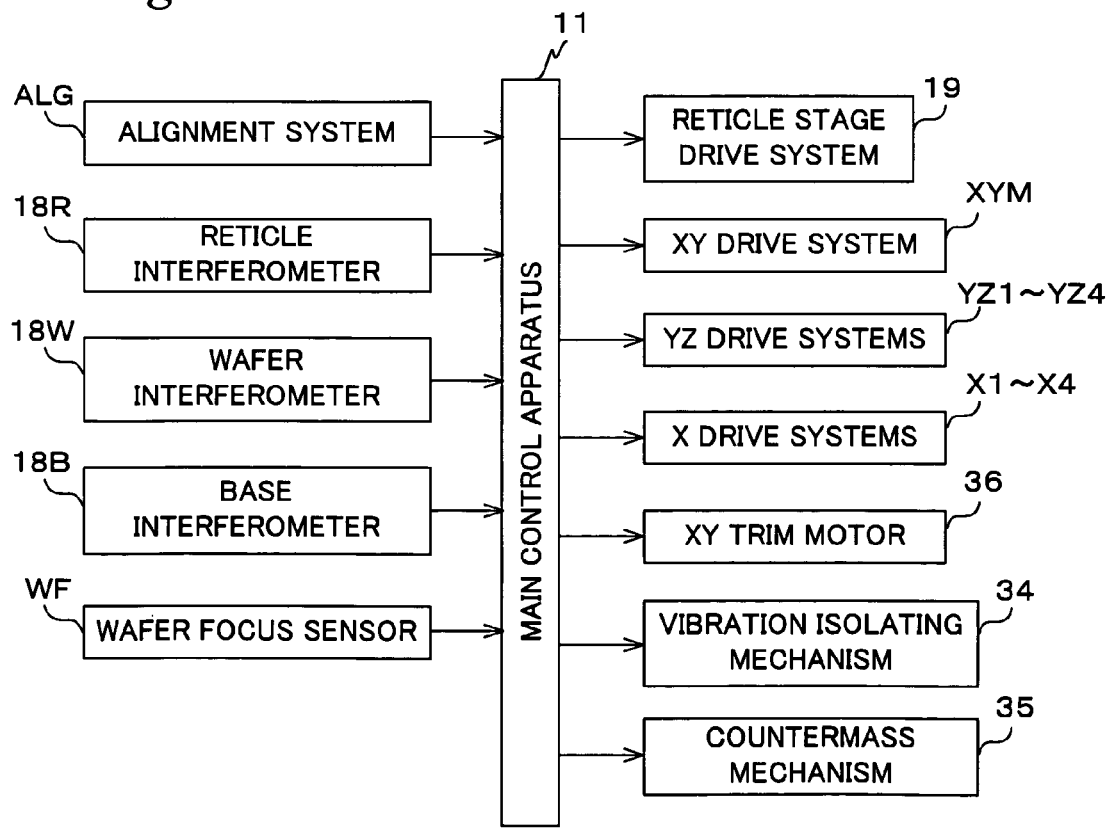
FIG. 10 is a block diagram of a control system of the exposure apparatus.

FIG. 10 is a block diagram of the control system (with some parts omitted) related to stage control of the exposure apparatus 10 of the present embodiment. The control system in FIG. 10 comprises a so-called microcomputer (or workstation) that comprises, for example, a CPU (central processing unit), ROM (read-only memory), and RAM (random access memory); furthermore, the heart of the control system is the main control apparatus 11, which provides supervisory control of the entire apparatus.

In addition, the exposure apparatus 10 shown in FIG. 1 has an off-axis type alignment system ALG in the vicinity of the projection unit PU. As the alignment system ALG, an alignment sensor of an image processing type FIA (field image alignment) system is used that, for example: irradiates a target mark with a broadband detection light beam that does not photosensitize the resist on the wafer W; uses an imaging capturing device (e.g., a CCD) and the like to capture an image of an index (not shown) and an image of a target mark imaged on a light receiving surface by the light reflected from that target mark; and outputs those captured image signals. The alignment system ALG supplies the positional information regarding the mark, which is defined in reference to the index center, to the main control apparatus 11. Based on this supplied information and the measurement values of the wafer interferometers 18W, the main control apparatus 11 acquires the position of a detection target mark—specifically, a second fiducial mark on the fiducial mark plate or an alignment mark on the wafer—within a stage coordinate system defined by the length measuring axes of the wafer interferometers 18W.

With the exposure apparatus 10 of the present embodiment configured as explained above, prescribed preparatory procedures are performed; for example, first, the wafer W and the reticle R are loaded onto the wafer stage WST and the reticle stage RST, respectively, and then reticle alignment, baseline measurement, wafer alignment (e.g., EGA (enhanced global alignment)), and the like are performed. Subsequently, under the control of the main control apparatus 11, the wafer stage WST is moved to an acceleration start position for exposing a first shot region of the wafer W, and the reticle stage RST is moved such that the position of the reticle R coincides with the acceleration start position. Furthermore, the first shot region on the wafer W is exposed by synchronously driving the reticle stage RST and the wafer stage WST in the Y axial directions. By subsequently exposing all of the shot regions on the reticle, the exposure of the wafer W is completed.

According to the present embodiment as explained above, the torque that acts upon the wafer drive system, which includes the base 30 and the like, owing to the acceleration and deceleration of the wafer stage WST on the base 30 during the exposure operation and the torque that acts upon the wafer drive system generated by the driving of the countermasses 35b of the countermass devices 35 along the corresponding linear guides 35a at a prescribed acceleration are cancelled out. Thereby, the torque that acts upon the wafer drive system is cancelled and the exposure apparatus 10 can expose the wafer W with good accuracy.

In addition, the base 30 is supported by the support platform 37, which is installed on the floor surface 102, via the vibration isolating devices 34. Accordingly, vibrations that occur in the wafer drive system owing to the movement of the wafer stage WST and the countermasses 35b of the countermass devices 35 are isolated from the support platform 37. Accordingly, vibrations that occur in the wafer drive system can be prevented from propagating to, for example, the illumination system 12 and the reticle stage RST, which are constituent elements of the exposure apparatus 10.

Furthermore, the present embodiment explained a case wherein the countermass devices 35 are placed on the +Y side and −Y side end parts of the base 30, but the present invention is not limited thereto; for example, the countermass devices 35 may be placed at three or more locations on the lower surface of the base 30. In this case, torques could be applied to the wafer drive system around axes other than the axis S discussed above.

In addition, the above embodiment explained a case wherein the armature unit 58 is placed on the coarse motion stage WRS side, but the present invention is not limited thereto; for example, an armature unit may be placed on the base 30 side and magnet units may be placed on the coarse motion stage WRS side.

In addition, the above embodiment explained a case wherein the present invention is adapted to the wafer stage apparatus 100, which comprises the one wafer stage WST, but the present invention is not limited thereto; accordingly, the present invention can also be adapted to a wafer stage apparatus that comprises two or more wafer stages.

In addition, a surface shape detection apparatus that detects the surface shape of the wafer W may be used instead of the wafer focus sensor WF of the embodiment described above. It is conceivable to use a surface shape detection apparatus that comprises: a radiating system, which obliquely irradiates a wafer with, for example, a line shaped beam longer than the diameter of the wafer; and a light receiving system that has a detector, for example, an one dimensional CCD sensor or a line sensor, that receives the reflected light of the beam radiated from the radiating system. Accordingly, based on a principle equivalent to the well known detection principle of multipoint AF systems, a plurality of point shaped irradiation areas are used as measurement points and the Z position of the wafer (i.e., the position of the wafer in the Z axial directions perpendicular to a prescribed surface, namely an XY plane, within which the wafer moves) can be acquired at each of the measurement points. In this case, the distribution of the Z positions of the front surface of the wafer is calculated before the start of an exposure; then, when an exposure operation is to be performed, the position in the Z axial directions and the attitude of the fine motion stage can be controlled based on the result of this calculation.

In addition, in the embodiment discussed above, a planar motor is used as the drive apparatus that drives the coarse motion stage WRS, but the present invention is not limited thereto, and a linear motor may be used.

In addition, the embodiment discussed above explained a case wherein the wafer stage apparatus of the present invention is used in the wafer stage apparatus, but the present invention is not limited thereto; for example, it is also possible to use the stage apparatus of the present invention in the reticle stage RST.

In addition, the embodiment discussed above explained a case wherein the present invention is used in the wafer stage apparatus 100, which holds the wafer front surface parallel to a horizontal plane (i.e., an XY plane), but the present invention is not limited thereto; for example, it is also possible to use the present invention in a wafer stage that holds the wafer front surface substantially parallel to a plane orthogonal to the XY plane (i.e., in a vertical stage).

In addition, the projection optical system PL in the exposure apparatus 10 of the embodiment mentioned above is not limited to a reduction system, and may be a unity magnification system or an enlargement system; furthermore, the projection optical system PL is not limited to a dioptric system and may be a catoptric system or a catadioptric system; in addition, the projected image may be either an inverted image or an erect image.

In addition, the present invention can also be adapted to the immersion exposure apparatus disclosed in PCT International Publication No. WO2004/53955. In addition, the exposure apparatus 10 of the embodiment discussed above may comprise a measurement stage that is separate from the wafer stage, as disclosed in, for example, PCT International Publication No. WO2005/074014.

In addition, the abovementioned embodiment explained a case wherein the present invention is adapted to a step-and-scan type scanning exposure apparatus, but the range of application of the present invention is of course not limited thereto. Namely, the present invention can also be adapted to a step-and-repeat type projection exposure apparatus, a step-and-stitch type exposure apparatus, a proximity type exposure apparatus, a mirror projection aligner, and the like.

In addition, the application of the exposure apparatus is not limited to an exposure apparatus for fabricating semiconductor devices, but can be widely adapted to, for example, an exposure apparatus for fabricating liquid crystal devices, wherein a liquid crystal display device pattern is transferred to a rectangular glass plate, as well as to exposure apparatuses for fabricating organic electroluminescent displays, thin film magnetic heads, image capturing devices (e.g., CCDs), micromachines, and DNA chips. In addition to fabricating microdevices like semiconductor devices, the present invention can also be adapted to an exposure apparatus that transfers a circuit pattern to a glass substrate, a silicon wafer, or the like in order to fabricate a reticle or a mask used by a visible light exposure apparatus, an EUV exposure apparatus, an X-ray exposure apparatus, an electron beam exposure apparatus, and the like.

In addition, the illumination light IL is not limited to ArF excimer laser light (with a wavelength of 193 nm), but may be ultraviolet light, such as KrF excimer laser light (with a wavelength of 248 nm), or vacuum ultraviolet light, such as $F_2$ laser light (with a wavelength of 157 nm). For example, higher harmonics may also be used as the vacuum ultraviolet light by utilizing, for example, an erbium (or erbium-ytterbium) doped fiber amplifier to amplify single wavelength laser light in the infrared region or the visible region that is generated from a DFB semiconductor laser or a fiber laser, and then using a nonlinear optical crystal for wavelength conversion to convert the output laser light to ultraviolet light.

In addition, the illumination light IL of the exposure apparatus 10 in the abovementioned embodiment is not limited to light with a wavelength of 100 nm or greater, and, of course, light with a wavelength of less than 100 nm may be used. For example, in recent years an extreme ultraviolet (EUV) exposure apparatus has been under development wherein, to expose patterns of less than 70 nm, EUV light in the soft X-ray region (e.g., in the wavelength region of 5-15 nm) is generated by using SOR or a plasma laser as the light source, and a fully catoptric reduction optical system and a reflective mask designed to work with wavelengths of less than that exposure wavelength (e.g., 13.5 nm) are used. It is conceivable to configure this apparatus such that a scanning exposure is performed by synchronously scanning the mask and the wafer using arcuate illumination, and therefore the present invention is also applicable thereto. In addition, the present invention can also be adapted to an exposure apparatus that uses a charged particle beam, such as an electron beam or an ion beam.

In addition, in the embodiment discussed above, an optically transmissive mask (i.e., a reticle) is used wherein a prescribed shielding pattern (or a phase pattern or dimming pattern) is formed on an optically transmissive substrate; however, instead of such a reticle, an electronic mask (or a variable forming mask), including a digital micromirror device (DMD), which is one type of a non light emitting image display device (also called a spatial light modulator), may be used wherein a transmittance pattern, a reflected pattern, or a light emitting pattern is formed based on electronic data of the pattern to be exposed, as disclosed in, for example, U.S. Pat. No. 6,778,257. Let us consider a case wherein a variable forming mask is used; once the exposure of shot regions—of a plurality of block areas on the wafer—during the detection of alignment marks is complete, if, taking the alignment mark detection discussed above into consideration, at least one other shot region is to be exposed, then the relative position between the wafer and the pattern image may be controlled by changing the transmittance or reflected pattern to be formed based on the electronic data.

Incidentally, the disclosures of all the Published PCT International Applications, the U.S. Patent Application Publication descriptions and the U.S. Patent descriptions that are cited in the description so far related to exposure apparatuses and the like are each incorporated herein by reference.

In addition, semiconductor devices are manufactured by the following steps: a step that designs the functions and performance of the device; a step that fabricates a reticle based on the designing step; a step that manufactures a wafer from a silicon material; a lithography step that transfers the pattern formed on the mask to a photosensitive object using the exposure apparatus according to the abovementioned embodiment wherein the pattern transfer characteristics have been adjusted by the adjusting method discussed above; a device assembling step (which includes a dicing process, a bonding process, and a packaging process); an inspecting step; and the like. In this case, the exposure apparatus of the abovementioned embodiment, wherein the pattern transfer characteristics have been adjusted in the lithography step, is used, and therefore the productivity of highly integrated device fabrication can be improved.

While the above-described embodiment of the present invention is the presently preferred embodiment thereof, those skilled in the art of lithography systems will readily recognize that numerous additions, modifications, and substitutions may be made to the above-described embodiments without departing from the spirit and scope thereof. It is intended that all such modifications, additions, and substitutions fall within the scope of the present invention, which is best defined by the claims appended below.

What is claimed is:

1. A moving body apparatus, comprising:
    a moving body;
    a planar motor comprising a first member that is provided to the moving body and a second member that cooperates with the first member to generate a thrust that moves the moving body along a predetermined plane;
    a reaction member to which the second member is attached, and which is movable in a direction opposite to a direction in which the first member and the moving body move, while movably supporting the moving body; and
    a canceling device that applies to the reaction member a force that cancels a torque generated around a center of gravity of a system that includes the reaction member and the moving body, when the moving body moves by the thrust, wherein
    the canceling device is located below the reaction member with respect to the moving body.

2. The moving body apparatus according to claim 1 wherein
    the canceling device applies the force to the reaction member in a direction orthogonal to the predetermined plane in at least three points of application whose positions differ within a plane parallel to the predetermined plane.

3. The moving body apparatus according to claim 1 wherein
    the canceling device has
    a mass body that moves in an orthogonal axial direction, which is a direction orthogonal to the predetermined plane;
    a guide that is provided to the reaction member and guides the mass body in the orthogonal axial direction; and
    an actuator that moves the mass body with respect to the guide in accordance with movement of the moving body.

4. The moving body apparatus according to claim 3 wherein
    the actuator drives the mass body at an acceleration that is in accordance with a distance between a center of gravity of the system including the reaction member and the moving body within a plane parallel to the predetermined plane and a point of application of the force.

5. The moving body apparatus according to claim 3 wherein
    the actuator drives the mass body with an acceleration that is in accordance with magnitude of an acceleration of the moving body.

6. The moving body apparatus according to claim 1 wherein
    the moving body has an opposing surface, which opposes a surface of the reaction member, and a holding surface, which is provided to an upper part above the opposing surface and holds the object, and the thrust is generated between the opposing surface and the surface of the reaction member.

7. The moving body apparatus according to claim 1, further comprising:
    a plurality of vibration isolating devices that support the reaction member,
    wherein the reaction member is supported by each of the plurality of vibration isolating devices such that the reaction member is capable of being finely driven in a direction orthogonal to the predetermined plane.

8. An exposure apparatus that exposes an object by irradiating an energy beam, comprising:
    the moving body apparatus according to claim 1 in which the object is held by the moving body.

9. The moving body apparatus according to claim 1, further comprising:
    a vibration isolating device that supports the reaction member,
    wherein the vibration isolating device and the canceling device are located below the reaction member with respect to the moving body.

10. The moving body apparatus according to claim 1, wherein
the canceling device includes a mass body that moves in a direction orthogonal to the predetermined plane below the reaction member.

11. The moving body apparatus according to claim 1, further comprising:
a second moving body which is different from the moving body and is placed above the reaction member,
wherein the canceling device applies to the reaction member a force that cancels a torque generated around a center of gravity of a system that includes the reaction member, the moving body and the second moving body.

12. A moving body apparatus, comprising:
a drive system;
a moving body that is movable along a predetermined plane by a thrust generated by the drive system;
a reaction member that supports the moving body to be movable along the predetermined plane, and moves in a direction opposite to a direction of the thrust; and
a canceling device that, through movement of the moving body, applies to the reaction member a force that cancels a torque generated around a center of gravity of a system including the reaction member and the moving body, wherein:
the canceling device comprises: a mass body that is movable in a direction intersecting the predetermined plane; a guide that is provided to the reaction member and guides the mass body in the direction intersecting the predetermined plane; and an actuator that moves the mass body with respect to the guide in accordance with the movement of the moving body, wherein
the canceling device is located below the reaction member with respect to the moving body.

13. The moving body apparatus according to claim 12 wherein
the drive system is a planar motor that comprises: a mover, which is provided to the moving body; and a stator, which is provided to the reaction member and applies the thrust between itself and the mover.

14. The moving body apparatus according to claim 12 wherein
the actuator drives the mass body at an acceleration that is in accordance with a distance between a center of gravity of the system including the reaction member and the moving body within a plane parallel to the predetermined plane and a point of application of the force.

15. The moving body apparatus according to claim 12 wherein
the actuator drives the mass body with an acceleration that is in accordance with magnitude of an acceleration of the moving body.

16. The moving body apparatus according to claim 12 wherein
the moving body has an opposing surface, which opposes a surface of the reaction member, and a holding surface, which is provided to an upper part above the opposing surface and holds the object, and the thrust is generated between the opposing surface and the surface of the reaction member.

17. The moving body apparatus according to claim 12, further comprising:
a plurality of vibration isolating devices that support the reaction member,
wherein the reaction member is supported by each of the plurality of vibration isolating devices such that the reaction member is capable of being finely driven in a direction orthogonal to the predetermined plane.

18. An exposure apparatus that exposes an object by irradiating an energy beam, comprising:
the moving body apparatus according to claim 10 in which the object is held by the moving body.

19. The moving body apparatus according to claim 12, further comprising:
a vibration isolating device that supports the reaction member,
wherein the vibration isolating device and the canceling device are located below the reaction member with respect to the moving body.

20. The moving body apparatus according to claim 12, wherein
the canceling device includes a mass body that moves in a direction orthogonal to the predetermined plane below the reaction member.

21. The moving body apparatus according to claim 12, further comprising:
a second moving body which is different from the moving body and is placed above the reaction member, the second moving body being movable along the predetermined plane by a thrust generated by the drive system,
wherein the canceling device applies to the reaction member a force that cancels a torque generated around a center of gravity of a system that includes the reaction member, the moving body and the second moving body.

* * * * *